Aug. 11, 1970 S. HORBACH 3,524,156

PRINTED CIRCUIT TRANSFORMER BOBBIN

Filed Aug. 26, 1968 2 Sheets-Sheet 1

INVENTOR.
STEPHEN HORBACH
BY Kenyon & Kenyon
ATTORNEYS

Aug. 11, 1970 S. HORBACH 3,524,156

PRINTED CIRCUIT TRANSFORMER BOBBIN

Filed Aug. 26, 1968 2 Sheets-Sheet 2

INVENTOR.
STEPHEN HORBACH

BY Kenyon & Kenyon

ATTORNEYS

United States Patent Office
3,524,156
Patented Aug. 11, 1970

3,524,156
PRINTED CIRCUIT TRANSFORMER BOBBIN
Stephen Horbach, 40 Glen Road, Mountain Lakes, N.J. 07046
Filed Aug. 26, 1968, Ser. No. 755,341
Int. Cl. H01j 27/30
U.S. Cl. 336—208 46 Claims

ABSTRACT OF THE DISCLOSURE

The transformer bobbin is of two piece construction to utilize light and heavy wires. The terminal board portion is of thermosetting material so as to permit repeated dip soldering of the terminals without damaging the board portion. The bobbin is of resilient thermoplastic material to permit snapping into the terminal board portion in an interlocked relation.

This invention relates to a transformer bobbin. More particularly, this invention relates to a printed circuit transformer bobbin.

Heretofore, in order to mount an electrical coil, such as for a transformer, on a printed cricuit board in a secure manner against breaking away, a winding bobbin containing the electrical coil has frequently been mounted within vertical mounting channels clipped to the printed circuit boards. However, such transformer bobbin mountings have become damaged or broken away from the printed circuit boards under severe shock conditions. Further, in some instances, the transformer bobbins have occupied relatively large spaces in order to be mounted on printed circuit boards and thus have increased the overall costs of the printed circuit board arrangement. Also, in some instances, the transformer bobbins have been limited to the use of fine wires as the use of heavy wires has not been readily adapted to winding on the terminals for printed circuit boards.

Accordingly, it is an object of the invention to mount a transformer bobbin on a printed circuit board in a secure manner.

It is another object of the invention to provide a two piece construction for a transformer bobbin which can be quickly and easily mounted on a printed circuit board.

It is another object of the invention to provide a transformer bobbin which can be quickly and easily interlocked in a terminal board portion.

It is another object of the invention to mount a transformer bobbin on a printed circuit board in a minimum of space.

It is another object of the invention to use heavy wire in transformer bobbins.

Briefly, the invention provides a transformer bobbin which is made from two pieces and which can be quickly and easily interlocked and mounted on a printed circuit board. The transformer bobbin has a bobbin about which an electrical coil is wound and a terminal board portion which receives the bobbin and is adapated for mounting on a printed circuit board. The bobbin and terminal board portion are formed with interlocking means so as to be readily locked together.

In addition, the bobbin has a plurality of lead insulating slots and barriers through which and around which leads of light wire are brought out of the bobbin and directed through lead exit holes in the terminal board portion adjacent respective terminals in the terminal board portion. The lead wires can then be individually wrapped around each terminal and dip soldered at one time in order to provide mechanical and electrical protection for the leads. Also, lead exit holes are provided in the terminal board portion so as to provide passageways for heavy wire leads directly through the terminal board portion so that these leads can be used as terminals without being wrapped around the terminals of the board portion.

The bobbin and terminal board portion are constructed in a manner to interlock with each other and to this end the bobbin is made of resilient thermoplastic material such as nylon, glass filled nylon, and polysulfone. Also, the terminal board portion is molded with thermosetting materials of electrical grade and glass reinforced such as DAP, epoxy, phenolic, polyester and silicone depending on the thermal requirements to allow dip soldering without loosening of the terminals.

These and other objects and advantages of the invention will become more apparent from the following detailed description and appended claims taken in conjunction with the accompanying drawings in which:

Figure 1:
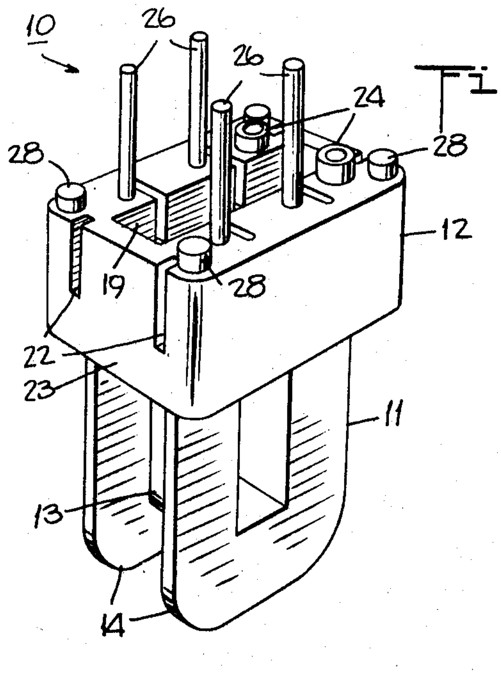
FIG. 1 illustrates a perspective view of a transformer bobbin according to the invention.

Referring to FIG. 1, the two-piece transformer bobbin 10 is formed by a bobbin 11, for example, of thermoplastic material, and a terminal board portion 12, for example, of thermosetting material, which are interlocked with each other.

Figure 2:
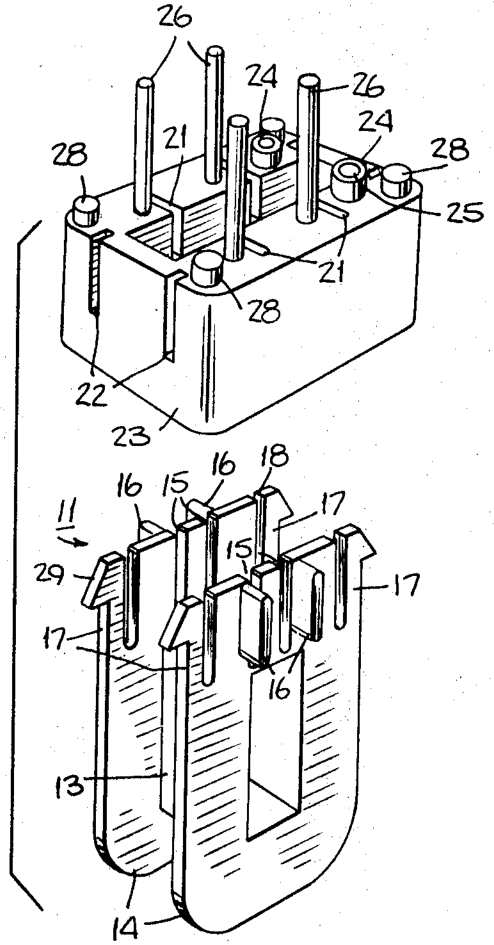
FIG. 2 illustrates an exploded perspective view of the transformer bobbin of FIG.1.

Referring to FIG. 2, the bobbin 11 is constructed with a central hollow spool 13 about which a wire (not shown) is adapted to be wound in known manner and a pair of flanges 14 on opposite sides of the spool 13 for retaining the windings of wire in place. The upper edges of each flange 14 is provided with a pair of lead insulating slots 15 through which the leads of the windings are led out from the spool 13 as well as with a pair of barriers 16 around which the leads are wound upon being led out from the spool 13. These pairs of barriers 16 are directed outwardly of the flanges 14 in a perpendicular direction and are of an elongated generally rectangular shape. Also, the pairs of barriers 16 are positioned on the flanges 14 adjacent the respective lead-insulating slots 15. Each flange 14 of the bobbin 11 is also provided with a pair of interlock tabs 17 on the opposite sides of the upper edge. Relief slots 18 are also provided in the flanges 14 behind each interlock tab 17 in order to allow deflection of the tabs 17 during insertion in the terminal board portion 12 and, where the tabs 17 are made of thermoplastic material, to eliminate the plastic memory of such material after insertion.

Referring to FIGS. 2 to 4, 6 and 7, the terminal board portion 12 is formed as a rectangular block having a base **12*b* and sides 12*s* there is a central rectangular aperture 19 in the base 12*b* and an internal rectangular recess 20 of larger dimensions than the aperture 19 below the aperture 19. The terminal board portion 12 also has a pair of slots 21 on two opposite sides of the aperture 19 which provides passageways for passage of the lead wires from the bobbin 11 through the board portion 12. These slots 21 extend perpendicularly from the aperture 19 into the board portion 12 to the same extent as the recess 20 so as to provide sufficient clearance for the lead wires extending upwardly from the barriers 16 of the bobbin 11. Further, a pair of slots 22 are formed in the outside of the end walls 23 of the board portion 12 and extend through the end walls 23 into communication with the recess 20. These slots 22 are spaced apart so as to receive the interlock tabs 17 of the bobbin 11** in interlocking relation.

Figure 6:
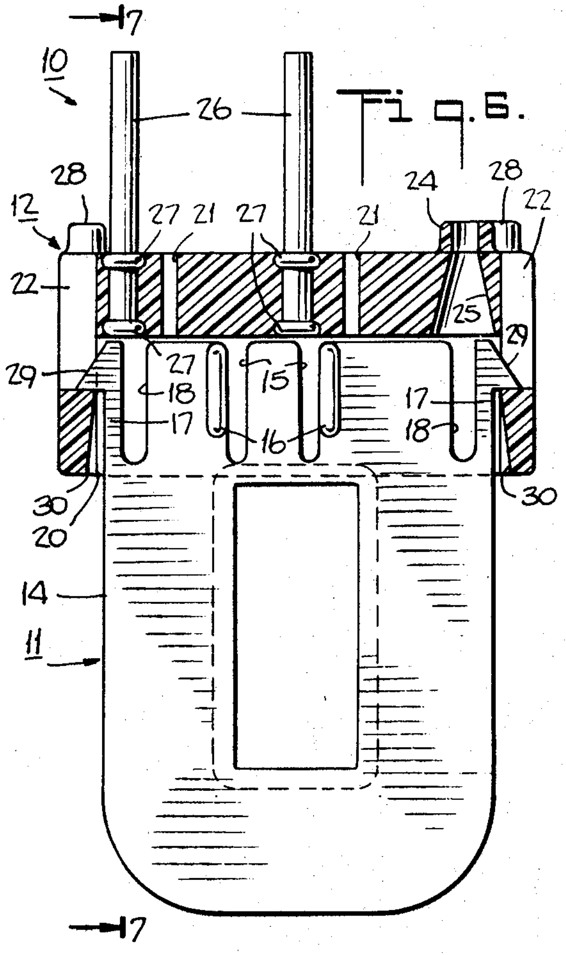
FIG. 6 illustrates a view taken on line 6—6 of FIG. 5.
Figure 3:
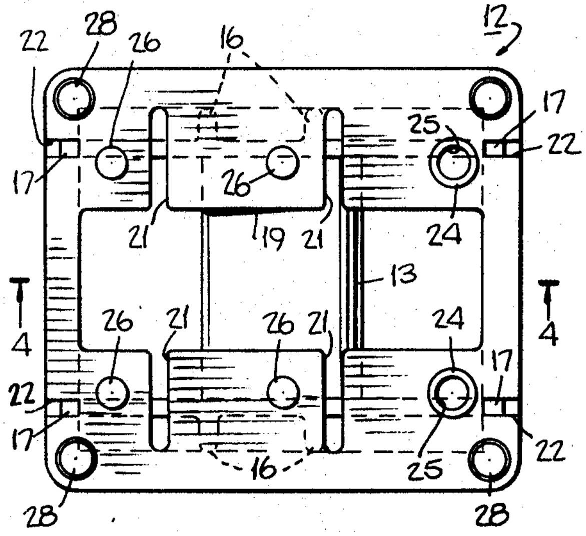
FIG. 3 illustrates a plan view of the terminal board portion of FIG. 1.

Referring to FIGS. 2 and 6, the terminal board portion 12 is provided with a pair of integral upstanding protuberances 24 which form lead exit holes 25 for heavy wires (not shown) when used for the windings on the bobbin 11. The protuberances 24 are positioned at one end of the board portion 12 to either side of the aperture 19 and the holes are tapered at the lower ends (as shown) to facilitate insertion of the heavy leads into the holes 25.

Figure 7:
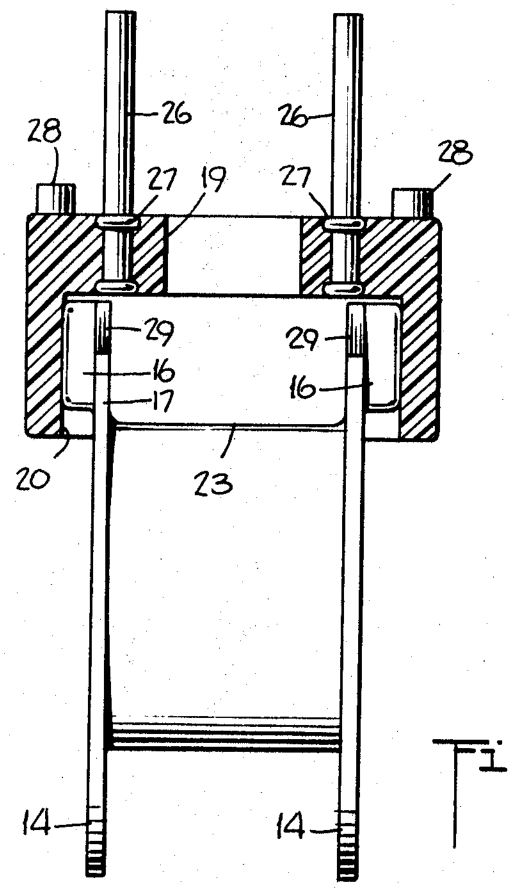
FIG. 7 illustrates a cross-sectional view of the transformer bobbin taken on line 7—7 of FIG. 6.
Figure 4:
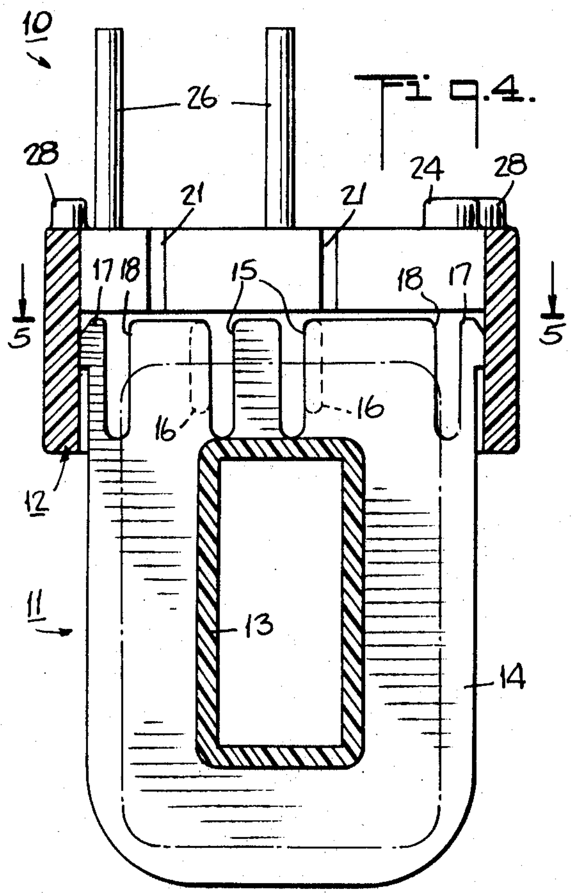
FIG. 4 illustrates a view of the transformer bobbin taken on line 4—4 of FIG. 3.

Referring to FIGS. 6 and 7, the terminal board portion 12 has a plurality of terminals 26, for example, four, mounted in the upper surface adjacent the respective slots 21. These terminals 26 are (as shown most clearly in FIG. 7), relative to the axis of the spool 13, positioned no further outboard than are the flanges 14. Each terminal 26 is formed as a double headed round pin of a length of about .005 to .010 inch longer than the thickness of the terminal board portion 12 and is embedded in the board portion 12. The terminals 26 are mounted in the board portion 12 by inserting the terminals 26 into the thermosetting material of the board portion 12 during molding. At this time, the teirmnals 26 are deformed by .005 to .010 inch to provide a bend in the terminals 26 between the double heads 27 in the form of a hook so as to prevent the terminals 26 from rotating after molding is completed. The outside head 27 on each terminal 26 prevents molding material from seeping into the lead holds during molding and eliminates vertical flash along the length of the terminal pin.

Referring to FIGS. 1 and 2, the terminal board portion 12 is provided with upstanding cylindrical moisture pads 28 at each corner which serve to mount the bottom of the transformer bobbin 10 in spaced relation to the surface of a printed circuit board (not shown) in order to prevent accumulation of moisture therebetween.

Figure 5:
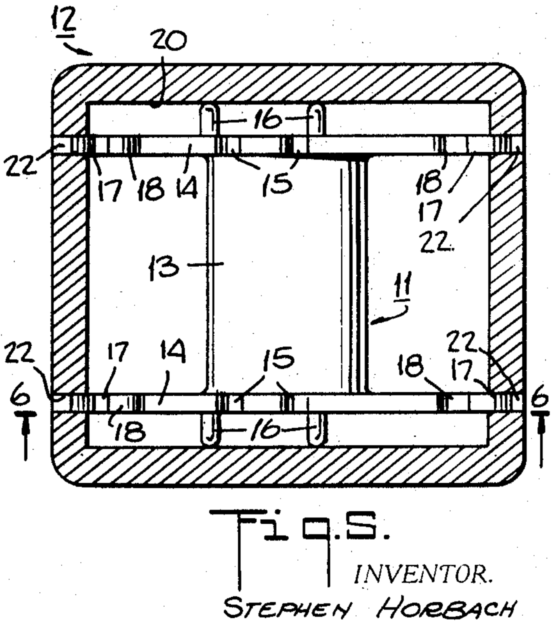
FIG. 5 illustrates a view taken on line 5—5 of FIG. 4.

In order to use the transformer bobbin 10, electrical coils of wire both light and heavy are wound around the spool 13 of the bobbin 11. The lead wires of the light wire coil are lead out through the insulating slots 15 and around the barriers 16 while the lead wires of the heavy wire coil are lead up from the spool 13. The light lead wires are then passed through the slots 21 and the heavy lead wires are passed through the holes 25 of the protuberances 24 of the terminal board portion 21. The bobbin 11 is then snapped into the recess 20. To facilitate passage of the bobbin 11 into the recess 20, the interlock tabs 17 and end walls 23 are provided with complementary tapered surfaces 29, 30, respectively, which facilitate flexing of the tabs 17 inwardly toward the relief slots 18. After insertion of the bobbin 11, the interlock tabs 17 project into the slots 22 of the end walls 23 (FIGS. 5 and 6) and abut the bottom surfaces of the slots 22 via tangs 30 on the ends of the tabs 17 to lock the bobbin 11 in place. Thereafter, the light lead wires are wound around the terminals 26 and dip soldered at one time in order to provide for mechanical and electrical protection of the leads. The exposed portions of the heavy wire leads in this case thereafter function as terminals. Also, the transformer bobbin 10 can be subjected to a varnish dip or impregnation operation with the varnish acting as a cement between the interlocking tabs and terminal board portion.

The transformer bobbin is then mounted on a printed circuit board by passing the terminals through suitable enlarged holes therein and by subsequently soldering the terminals in place on the board.

The invention thus provides a transformer bobbin of relatively simple construction which can be used with both light and heavy wires. The light wires are such as to be easily wound about the pin terminals of the transformer bobbin while the heavy wires are such as to provide their own terminals upon passage through the transformer bobbin. Because of this advantage, the transformer bobbin of the invention is able to reduce the costs which would otherwise be involved in attempting to use both light and heavy wires in a transformer bobbin.

Further, as the terminal board portion of the transformer bobbin of the invention is molded of thermosetting materials of electrical grade such permits dip soldering of the terminals without loosening of the terminals within the terminal board portion.

Also, by being of two-piece construction, the transformer bobbin of the invention allows terminals to be placed under the winding area (as may best be seen in FIG. 7) so that the overall height (that is, distance along the axis of the spool 13) of the unit is reduced along with a reduction in the mounting area required on a printed circuit board. The two-piece construction further facilitates a fully automatic winding of several windings, including heavy wire, such as No. 16 AWG, without using special winding arbors to handle the terminal board portion. The construction also allows the light wires to be wrapped about the pin terminals while also permitting the exposed leads of the heavy wires to act as terminals. Because of this, the heavy wire leads and light wire leads can be dip soldered in one operation thereby reducing labor in soldering operations. Further, taping of leads is eliminated and much space is saved through the loss of lead bulge inside of the winding area.

It is noted that provisions can be made on large size bobbins, such as a one inch steel lamination, to mount the whole transformer assembly including the lamination, by means of long screws passing through the holes in the lamination and clearance slots on the sides of the terminal board portion and through the printed circuit board. This feature provides added mounting strength, preventing the entire transformer unit from breaking away from the printed circuit board under severe shock. Also, inserts can be molded into the terminal board portion to provide extra mounting strength on smaller units.

What is claimed is:

1. A bobbin transformer comprising a bobbin having a pair of flanges defining a winding space, each of said flanges having a pair of interlocking tabs at one edge thereof; and a terminal board portion having a recess receiving said bobbin therein and pairs of slots in the walls thereof communicating with said recess and receiving said tabs there in interlocking engagement.

2. A bobbin transformer as set forth in claim 1 wherein said terminal board portion is made of thermosetting material.

3. A bobbin transformer as set forth in claim 2 wherein said bobbin is made of resilient thermoplastic material.

4. A bobbin transformer as set forth in claim 1 wherein said terminal board portion includes a pair of holes therein for passage of heavy wire leads from said bobbin.

5. A bobbin transformer as set forth in claim 1 wherein said terminal board portion includes at least one pair of upstanding terminals mounted therein to receive light wire leads from said bobbin.

6. A bobbin transformer as set forth in claim 5 wherein each flange of said bobbin has a pair of lead insulating slots and a pair of adjacent barriers extending outwardly thereof for guiding lead wires from between said flanges and said terminal board portion has pairs of lead exit slots adjacent said terminals to permit passage of the lead wires therethrough to said terminals.

7. A bobbin transformer as set forth in claim 1 wherein each tab is tapered to facilitate entry into said recess and respective slot.

8. A bobbin having a pair of flanges defining a winding area, each flange saving a pair of resilient tabs at one edge thereof, a pair of lead insulating slots between said tabs and a pair of barriers extending outwardly of said winding area.

9. A bobbin as set forth in claim 8 wherein each tab is resilient and is formed with a tapered surface.

10. A bobbin as set forth in claim 8 wherein each flange further includes a pair of relief slots, each relief slot being disposed between a tab and a lead insulating slot.

11. A coil bobbin comprising:

a winding portion having a spool and a pair of flanges, one of said flanges at each end of said spool, thereby defining a winding space around said spool and between said flanges, and a terminal block portion having a base and sides, terminals extending away from said base, and a recess within said sides, said recess receiving a first edge of each of said flanges, interengaging means at said first edges of said flanges and within said recess to interengage said winding portion and said terminal block portion.

12. The coil bobbin of claim 11 wherein said interengaging means includes tabs at said first edges of said flanges and slots in the walls of said recess, said slots being positioned to receive said tabs therein in interlocking engagement.

13. The coil bobbin of claim 12 wherein each of said tabs is resilient and is formed with a tapered surface to facilitate entry into said recess and said respective slot.

14. The coil bobbin of claim 13 wherein said first edges of said flanges include relief slots, one of said relief slots being disposed adjacent to each of said tabs to permit flexing of said tabs.

15. The coil bobbin of claim 11 wherein said terminal block portion has an aperture in said base in communication with said recess to permit wire leads from said winding portion to pass through said aperture.

16. The coil bobbin of claim 11 wherein said terminal block portion has holes through said base in communication with said recess for passage of heavy wire leads from said winding portion.

17. The coil bobbin of claim 16 wherein each of said holes for heavy wire leads includes a frusto-conical shaped portion having the larger diameter thereof positioned closer to said recess than to said base and having the smaller diameter thereof positioned closer to said base than to said recess.

18. The coil bobbin of claim 11 wherein, relative to the axis of said spool, said termnials are positioned on said base substantially no farther outboard than are said flanges.

19. The coil bobbin of claim 11 wherein said winding portion is made of a resilient thermoplastic material and said terminal block portion is made of a thermosetting material.

20. The coil bobbin of claim 12 wherein said terminal block portion has an aperture in said base in communication with said recess to permit wire leads form said winding portion to pass through said aperture.

21. The coil bobbin of claim 12 wherein said terminal block portion has holes through said base in communication with said recess for passage of heavy wire leads from said winding portion, each of said holes for heavy wire leads including a frusto-conical shaped portion having the larger diameter thereof positioned closer to said recess than to said base and having the smaller diameter thereof positioned closer to said base than to said recess.

22. The coil bobbin of claim 12 wherein, relative to the axis of said spools, said terminals are positioned on said base substantially no farther outboard than are said flanges.

23. The coil bobbin of claim 12 wherein said winding portion is made of a resilient thermoplastic material and said terminal block portion is made of a thermosetting material.

24. The coil bobbin of claim 13 wherein said terminal block portion has an aperture in said base in communication with said recess to permit wire leads from said winding portion to pass through said aperture.

25. The coil bobbin of claim 13 wherein said terminal block portion has holes through said base in communication with said recess for passage of heavy wire leads from said winding portion, each of said holes for heavy wire leads including a frusto-conical shaped portion having the larger diameter thereof positioned closer to said recess than to said base and having the smaller diameter thereof positioned closer to said base than to said recess.

26. The coil bobbin of claim 13 wherein, relative to the axis of said spool, said terminals are positioned on said base substantially no farther outboard than are said flanges.

27. The coil bobbin of claim 13 wherein said winding portion is made of a resilient thermoplastic material and said terminal block portion is made of a thermosetting material.

28. The coil bobbin of claim 14 wherein said terminal block portion has an aperture in said base in communication with said recess to permit wire leads from said winding portion to pass through said aperture.

29. The coil bobbin of claim 14 wherein said terminal block portion has holes through said base in communication with said recess for passage of heavy wire leads from said winding portion, each of said holes for heavy wire leads including a frusto-conical shaped portion having the larger diameter thereof positioned closer to said recess than to said base and having the smaller diameter thereof positioned closer to said base than to said recess.

30. The coil bobbin of claim 14 wherein, relative to the axis of said spool, said terminals are positioned on said base substantially no farther outboard than are said flanges.

31. The coil bobbin of claim 14 wherein said winding portion is made of a resilient thermoplastic material and said terminal block portion is made of a thermosetting material.

32. The coil bobbin of claim 15 wherein said terminal block portion has holes through said base in communication with said recess for passage of heavy wire leads from said winding portion, each of said holes for heavy wire leads including a frusto-conical shaped portion having the larger diameter thereof positioned closer to said recess than to said base and having the smaller diameter thereof positioned closer to said base than to said recess.

33. The coil bobbin of claim 15 wherein, relative to the axis of said spool, said terminals are positioned on said base substantially no farther outboard than are said flanges.

34. The coil bobbin of claim 15 wherein said winding portion is made of a resilient thermoplastic material and said terminal block portion is made of a thermosetting material.

35. The coil bobbin of claim 17 wherein, relative to the axis of said spool, said terminals are positioned on said base substantially no farther outboard than are said flanges.

36. The coil bobbin of claim 17 wherein said winding portion is made of a resilient thermoplastic material and said terminal block portion is made of a thermosetting material.

37. The coil bobbin of claim 18 wherein said winding portion is made of a resilient thermoplastic material and said terminal block portion is made of a thermosetting material.

38. The coil bobbin of claim 20 wherein said terminal block portion has holes through said base in communication with said recess for passage of heavy wire leads from said winding portion, each of said holes for heavy wire leads including a frusto-conical shaped portion having the larger diameter thereof positioned closer to said recess than to said base and having the smaller diameter thereof positioned closer to said recess than to said base and having the smaller diameter thereof positioned closer to said base than to said recess.

39. The coil bobbin of claim 20 wherein said winding portion is made of a resilient thermoplastic material and said terminal block portion is made of a thermosetting material.

40. The coil bobbin of claim 21 wherein, relative to the axis of said spools, said terminals are positioned on said base substantially no farther outboard than are said flanges.

41. The coil bobbin of claim 24 wherein, relative to the axis of said spools, said terminals are positioned on said base substantially no farther outboard than are said flanges, and wherein said winding portion is made of a resilient thermoplastic material and said terminal block portion is made of a thermosetting material.

42. The coil bobbin of claim 25 wherein, relative to the axis of said spools, said terminals are positioned on said base substantially no farther outboard than are said flanges, and wherein said winding portion is made of a resilient thermoplastic material and said terminal block portion is made of a thermosetting material.

43. The coil bobbin of claim 28 wherein said terminal block portion has holes through said base in communication with said recess for passage of heavy wire leads from said winding portion, each of said holes for heavy wire leads including a frusto-conical shaped portion having the larger diameter thereof positioned closer to said recess than to said base and having the smaller diameter thereof positioned closer to said base than to said recess.

44. The coil bobbin of claim 28 wherein, relative to the axis of said spool, said terminals are positioned on said base substantially no farther outboard than are said flanges, and wherein said winding portion is made of a resilient thermoplastic material and said terminal block is made of a thermosetting material.

45. The coil bobbin of claim 44 wherein said terminal block portion has holes through said base in communication with said recess for passage of heavy wire leads from said winding portion, each of said holes for heavy wire leads including a frusto-conical shaped portion having the larger diameter thereof positioned closer to said recess than to said base and having the smaller diameter thereof positioned closer to said base than to said recess.

46. The coil bobbin of claim 32 wherein, relative to the axis of said spool, said terminals are positioned on said base substantially no farther outboard than are said flanges, and wherein said winding portion is made of a resilient thermoplastic material and said terminal block portion is made of a thermosetting material.

References Cited

UNITED STATES PATENTS

| | | | |
|---|---|---|---|
| 2,249,057 | 7/1941 | Stahl | 336—192 |
| 2,732,529 | 1/1956 | Reid | 317—242 X |
| 3,340,436 | 9/1967 | Jones. | |
| 3,409,857 | 11/1968 | O'Neill. | |

OTHER REFERENCES

The Condensed Chemical Dictionary, sixth edition, 1963, Reinhold, N.Y., pp. 979–1113.

ELLIOT A. GOLDBERG, Primary Examiner

U.S. Cl. X.R.

317—101; 336—192